United States Patent
Tsutsumi et al.

(10) Patent No.: US 8,148,248 B2
(45) Date of Patent: Apr. 3, 2012

(54) SEMICONDUCTOR DEVICE AND MANUFACTURING METHOD THEREOF

(75) Inventors: Toshiaki Tsutsumi, Tokyo (JP); Tomonori Okudaira, Tokyo (JP); Keiichiro Kashihara, Tokyo (JP); Tadashi Yamaguchi, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/053,733

(22) Filed: Mar. 22, 2011

(65) Prior Publication Data

US 2011/0207317 A1    Aug. 25, 2011

Related U.S. Application Data

(62) Division of application No. 12/413,980, filed on Mar. 30, 2009, now Pat. No. 7,936,016.

(30) Foreign Application Priority Data

May 19, 2008  (JP) ................................. 2008-130740

(51) Int. Cl.
*H01L 21/3205* (2006.01)
*H01L 21/4763* (2006.01)
(52) U.S. Cl. ........ 438/589; 438/653; 438/655; 438/649; 257/751; 257/388
(58) Field of Classification Search .................. 438/589, 438/655, 649, 494, 653; 257/751, 388, E21.584
See application file for complete search history.

(56) References Cited

U.S. PATENT DOCUMENTS

| 6,291,890 | B1 |    | 9/2001  | Hamada           |         |
|-----------|----|----|---------|------------------|---------|
| 6,524,903 | B2 |    | 2/2003  | Ootsuka et al.   |         |
| 6,656,764 | B1 | *  | 12/2003 | Wang et al.      | 438/104 |
| 7,381,602 | B2 | *  | 6/2008  | Hohage et al.    | 438/197 |

FOREIGN PATENT DOCUMENTS

JP    09-283462    10/1997

* cited by examiner

*Primary Examiner* — Theresa T Doan
(74) *Attorney, Agent, or Firm* — McDermott Will & Emery LLP

(57) ABSTRACT

There is provided a semiconductor device having a metal silicide layer which can suppress the malfunction and the increase in power consumption of the device. The semiconductor device has a semiconductor substrate containing silicon and having a main surface, first and second impurity diffusion layers formed in the main surface of the semiconductor substrate, a metal silicide formed over the second impurity diffusion layer, and a silicon nitride film and a first interlayer insulation film sequentially stacked over the metal silicide. In the semiconductor device, a contact hole penetrating through the silicon nitride film and the first interlayer insulation film, and reaching the surface of the metal silicide is formed. The thickness of a portion of the metal silicide situated immediately under the contact hole is smaller than the thickness of a portion of the metal silicide situated around the contact hole.

3 Claims, 6 Drawing Sheets

SEMICONDUCTOR DEVICE AND MANUFACTURING METHOD THEREOF

CROSS-REFERENCE TO RELATED APPLICATIONS

This application is a Divisional of U.S. patent application Ser. No. 12/413,980, filed on Mar. 30, 2009, now U.S. Pat. No. 7,936,016, claiming priority of Japanese Patent Application No. 2008-130740, filed on May 19, 2008, the entire contents of each of which are hereby incorporated by reference.

BACKGROUND OF THE INVENTION

The present invention relates to a semiconductor device and a manufacturing method thereof. More particularly, it relates to a semiconductor device having a metal silicide layer, and a manufacturing method thereof.

In order to achieve a lower resistance of a semiconductor device, there has been generally employed a method in which a silicide is formed between the wiring material and the substrate. A conventional semiconductor device having a metal silicide layer is proposed in, for example, Patent Document 1.

[Patent Document 1]
Japanese Unexamined Patent Publication No. Hei 09 (1997)-283462

SUMMARY OF THE INVENTION

The present inventors have, for the first time, revealed the following problem: when contact holes are formed in an insulation film in order to form electrodes/wires to be in contact with the silicide layer, the leak current increases, which unfavorably causes the malfunction and the increase in power consumption of the device.

The present invention has been completed in view of the foregoing problem. It is an object of the present invention to provide a semiconductor device having a metal silicide layer, which can suppress the malfunction and the increase in power consumption of the device, and a manufacturing method thereof.

In order to solve the problem, the present inventors have conducted a close study on the reason why the leak current increases. As a result, they found the following reason.

When dry etching for forming contact holes in the insulation film is performed, in order to ensure a margin in the manufacturing process, the surface of the metal silicide layer immediately under the contact holes is overetched. In other words, fluctuations in film thickness and fluctuations in etching rate are inevitable during manufacturing of the insulation film. For this reason, an etching processing is required to be additionally performed in view of the fluctuations. The dry etching amount for forming contact holes is set as the amount obtained by adding the thickness equivalent to the overetching amount to the amount equivalent to the thickness of the insulation film. For etching, a carbon fluoride type gas is used.

At this step, contact holes are formed, so that overetching is performed with the surface of the metal silicide formed over the surface of the semiconductor substrate being exposed. When the surface of the metal silicide is dry etched, silicon in the metal silicide is selectively etched. Accordingly, in the surface of a portion of the metal silicide immediately under each contact hole, a silicon depletion layer (metal-rich layer) in which silicon has been depleted and metal components have been relatively increased in amount is formed.

When the metal contained in the metal silicide is nickel (Ni), the composition of the metal silicide is NiSi having the lowest electric resistance, or most stable $NiSi_2$. However, when silicon is removed by overetching, the composition ratio of the metal and silicon becomes larger than 1. For example, when the metal is Ni, the composition of the material forming the silicon depletion layer is $Ni_xSi$ (where x>1).

After etching for opening the contact holes, a metal including tungsten is embedded in each contact hole as a contact plug. Further, in the overlying layer thereof, a multilayer wiring structure including a metal wire of copper, aluminum, or the like is formed. In that step, a heat treatment at 400° C. or more is added thereto. At a temperature of 360° C. or more, silicon and a metal react with each other to be recrystallized, so that a metal silicide is formed. Resultingly, in the temperature region of 400° C. or more, the silicide reaction further proceeds in the metal-rich layer having a large metal composition.

At this step, silicon for forming the metal silicide is supplied from the semiconductor substrate to the metal-rich layer. In other words, the metal silicide grows toward the substrate side. Immediately under the contact holes, the metal silicide grows in the direction of the substrate. Therefore, as compared with the metal silicide region around the contact holes, a metal silicide having a relatively large thickness is formed. Whereas, the metal silicide reaction proceeds isotropically by the heat treatment. Accordingly, the metal silicide grows not only in the direction of thickness of the substrate but also in the direction of plane of the substrate.

With the trend toward higher integration of a LSI (Large Scale Integration), particularly, in the underlying part of the sidewall of a FET (Field Effect Transistor), the PN junction depth becomes shallower, and further, the distance between the contact hole and the sidewall becomes narrower. The site at which the PN junction is shallowest is a region called an extension in the underlying part of the sidewall spacer. When a metal silicide grows in the underlying part of the sidewall, the junction is broken at the side at which the PN junction is shallowest. This results in an increase in junction leak current from the drain region of the transistor to the substrate, which deteriorates the performances of the device.

Under such circumstances, the present inventors found out the following: by performing a heat treatment after dry etching with no silicon depletion layer present, it is possible to suppress the increase in leak current. This has led to the completion of the present invention.

Namely, each semiconductor device in accordance with embodiments of the present invention has a semiconductor substrate containing silicon, and having a main surface. The semiconductor device further has an impurity diffusion layer formed over the main surface of the semiconductor substrate. The semiconductor device further has a metal silicide layer formed over the impurity diffusion layer. The semiconductor device further has an insulation film stacked over the metal silicide layer. In the semiconductor device, a contact hole penetrating through the insulation film and reaching the surface of the metal silicide layer is formed. In the surface of the metal silicide layer, a recess part is formed. The thickness of a portion of the metal silicide layer situated immediately under the contact hole is smaller than the thickness of a portion of the metal silicide layer situated around the contact hole.

With the semiconductor device in accordance with this embodiment, the silicon depletion layer formed immediately under each contact hole is etched, and removed. As a result, a recess part is formed in the surface of the metal silicide layer. For this reason, the silicon depletion layer will not further consume the silicon contained in the semiconductor substrate. In other words, it is possible to prevent the metal silicide layer in the underlying part of the contact hole from growing in the heat treatment after dry etching. This can prevent the malfunction and the increase in power consumption of the semiconductor device due to PN junction breakage.

DESCRIPTION OF THE PREFERRED EMBODIMENTS

Below, an embodiment of the present invention will be described with reference to the accompanying drawings.

(Embodiment 1) FIGS. 1 to 8 are schematic views for illustrating respective steps of a manufacturing method of a semiconductor device in accordance with Embodiment 1 of the present invention. By reference to FIGS. 1 to 8, the semiconductor device and the manufacturing method thereof of Embodiment 1 will be described.

Figure 1:
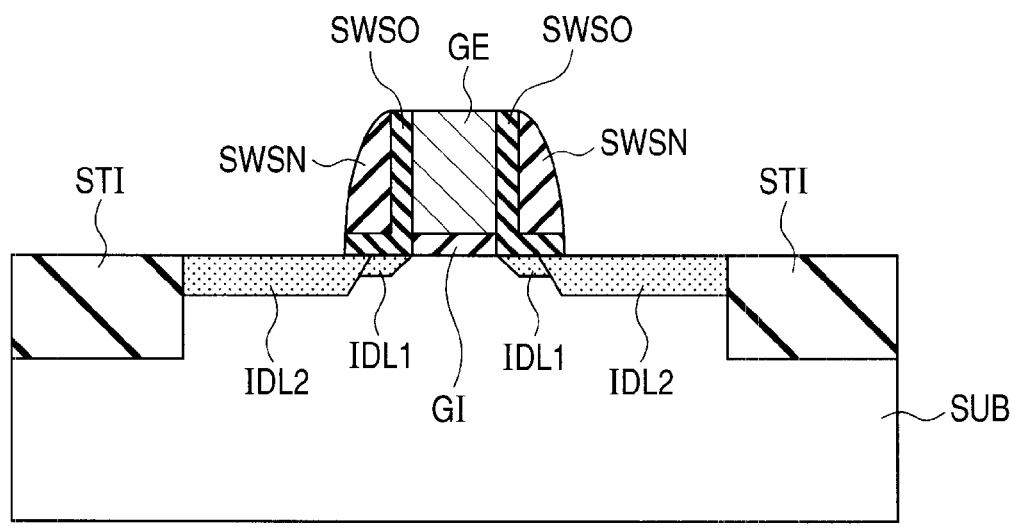
FIG. 1 is a schematic view showing a first step of a manufacturing method of a semiconductor device of Embodiment 1.

As shown in FIG. 1, in a region defined by an element isolation insulation film STI of a semiconductor substrate SUB which is a silicon (Si) substrate, a gate electrode GE including polysilicon is formed with a gate insulation film GI interposed therebetween. The gate electrode GE can be formed with a height of, for example, 100 nm. Over the main surface of the semiconductor substrate SUB, a first impurity diffusion layer IDL1 formed by ion implantation is formed with the gate electrode GE as a mask.

At the side surface of the gate electrode GE, a sidewall spacer is formed. The sidewall spacer is formed by lamination of a silicon oxide film SWSO and a silicon nitride film SWSN. A second impurity diffusion layer IDL2 is formed over the main surface of the semiconductor substrate SUB with the gate electrode GE and the sidewall as a mask.

Figure 2:
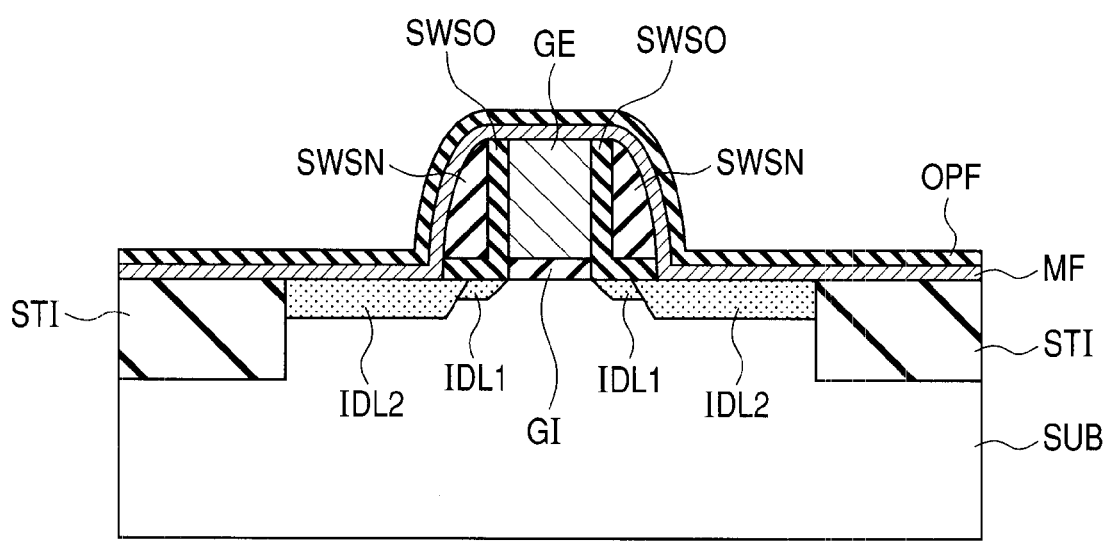
FIG. 2 is a schematic view showing a second step of the manufacturing method of the semiconductor device of Embodiment 1.

Then, as shown in FIG. 2, the natural oxide film of the exposed silicon surface (i.e., the surfaces of the element isolation insulation film STI, the second impurity diffusion layer IDL2, the silicon oxide film SWSO, the silicon nitride film. SWSN, and the gate electrode GE) is removed. Thereafter, by a sputtering process, a metal film MF including, for example, nickel (Ni) is formed with a thickness of 10 nm over the silicon surface. For the purpose of preventing the oxidation of the metal film MF, an oxidation preventive film OPF including, for example, TiN is formed with a thickness of, for example, 10 nm over the metal film MF.

Figure 3:
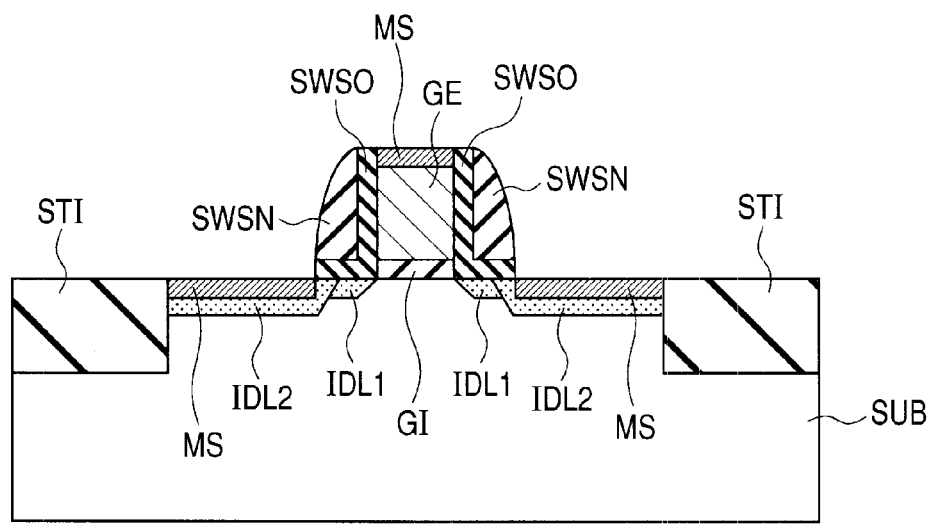
FIG. 3 is a schematic view showing a third step of the manufacturing method of the semiconductor device of Embodiment 1.

Then, as shown in FIG. 3, a heat treatment at 250° C. to 400° C. is performed. Thus, the metal film MF and silicon exposed in the gate electrode GE and the second impurity diffusion layer IDL2 are allowed to react with each other to form a metal silicide MS. The unsilicided portions of the metal film MF and the oxidation preventive film OPF are removed by SPM (Sulfuric acid Hydrogen Peroxide Mixture) or the like. Thereafter, a heat treatment is further performed at 400° C. to 600° C., so that Ni silicide containing NiSi or $NiSi_2$ as a metal silicide layer is formed. The metal silicide MS is formed over the gate electrode GE and the second impurity diffusion layer IDL 2.

Figure 4:
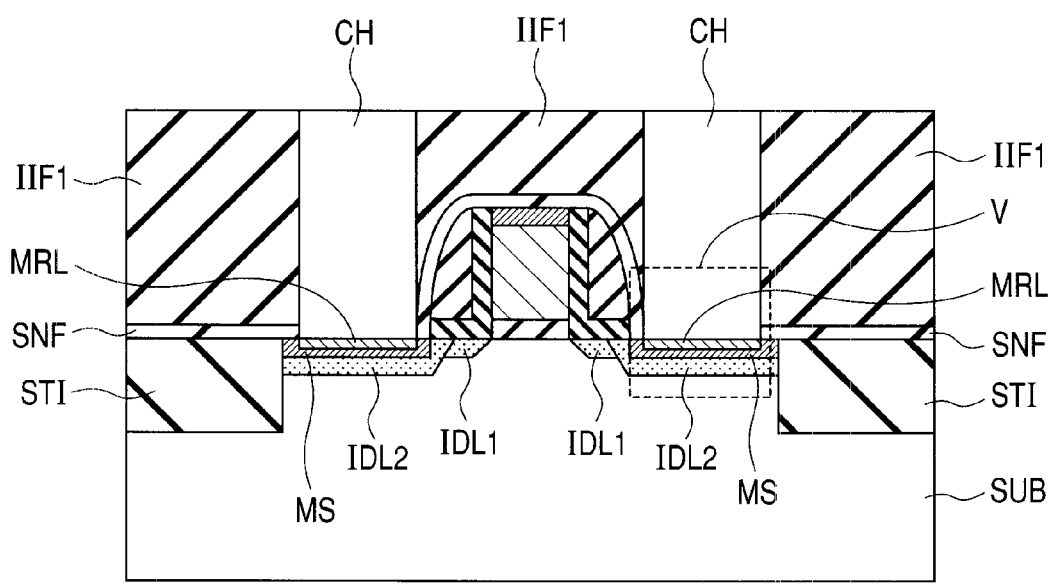
FIG. 4 is a schematic view showing a fourth step of the manufacturing method of the semiconductor device of Embodiment 1.

Then, as shown in FIG. 4, a silicon nitride film SNF is formed with a thickness of, for example, 20 to 50 nm with a CVD (Chemical Vapor Deposition) process. Over the silicon nitride film SNF, a first interlayer insulation film IIF1 including a silicon oxide film is formed with a CVD process. Then, the surface of the first interlayer insulation film IIF1 is planarized by a CMP (Chemical Mechanical Polishing) process. The silicon nitride film SNF and the first interlayer insulation film IIF1 are included in the insulation film. The insulation film is formed over the metal silicide MS. The silicon nitride film SNF as the first insulation film is formed in such a manner as to overlap a part of the metal silicide MS. The first interlayer insulation film IIF1 as the second insulation film is stacked over the silicon nitride film SNF.

Then, by combination of lithography and etching, contact holes CH are formed to expose the metal silicide MS in the semiconductor substrate SUB. Each contact hole CH is formed in such a manner as to penetrate through the silicon nitride film SNF as the insulation film and the first interlayer insulation film IIF1, and to reach the surface of the metal silicide MS.

Figure 5:
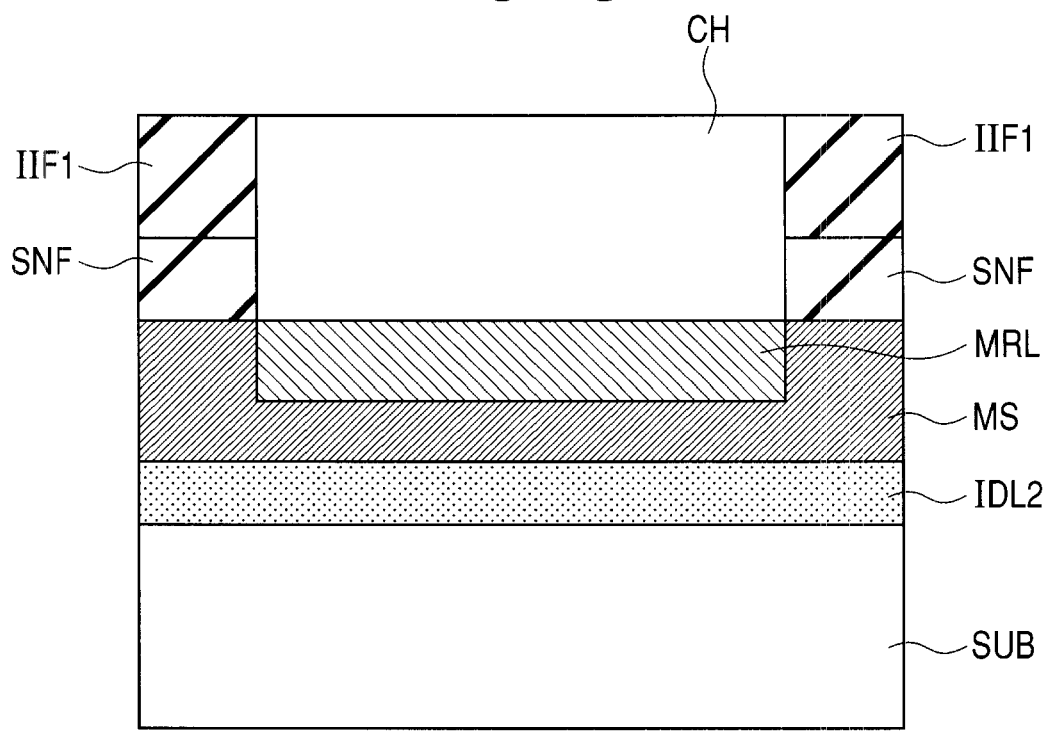
FIG. 5 is a schematic view showing the vicinity of a region V in FIG. 4 on an enlarged scale.

When dry etching for forming the contact holes CH is performed, the surface of the metal silicide MS immediately under the contact hole CH is overetched. When the surface of the metal silicide MS is dry etched, silicon of the components contained in the metal silicide MS is selectively etched. Then, as shown in FIGS. 4 and 5, in the surface of the metal silicide MS, a metal-rich layer MRL as a silicon depletion layer depleted of silicon and relatively increased in metal component content is formed. For example, when the metal film MF is formed of Ni, the composition of the material forming the metal-rich layer MRL is expressed as $Ni_xSi$ (where x>1).

In the post-step of manufacturing of the semiconductor substrate, when the metal-rich layer MRL is heated to 400° C. or more, the metal silicide MS grows toward the semiconductor substrate SUB, which causes junction breakage. Thus, in Embodiment 1, by selectively removing the metal-rich layer MRL depleted of silicon, formed immediately under the contact hole CH, the increase in leak current is suppressed.

The metal-rich layer MRL can be removed by performing wet etching using, for example, SPM or APM (Ammonia and Hydrogen Peroxide Mixture) as a treating solution. For example, SPM obtained by mixing sulfuric acid and oxygenated water in a volume ratio of 7:3 is heated to a temperature of 100° C. or more and 150° C. or less, to be used. Thus, by a treatment for a treatment time within the range of 5 minutes or more and 30 minutes or less, the metal-rich layer MRL can be removed. Typically, the whole of the metal-rich layer MRL is removed by the wet etching. The concentration of the treating solution is adjusted to the optimum concentration for dissolving the metal-rich layer MRL with efficiency.

Figure 6:
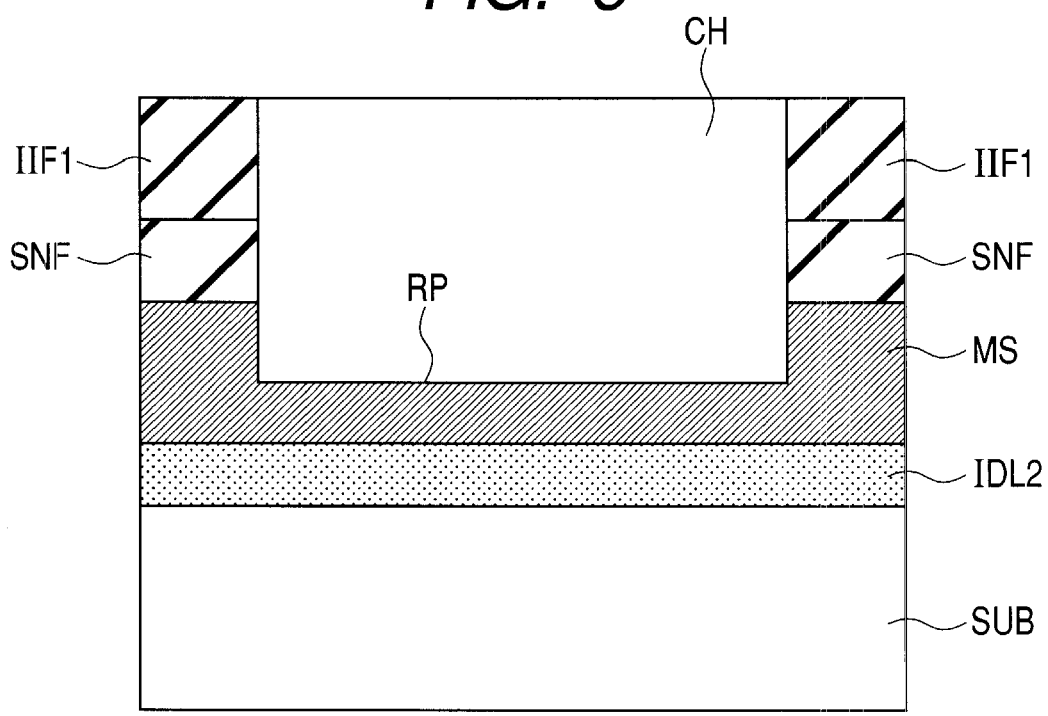
FIG. 6 is a schematic view showing a fifth step of the manufacturing method of the semiconductor device of Embodiment 1.

At this step, the metal silicide MS around the contact hole, i.e., in the region not affected by overetching of the contact hole CH, the metal silicide MS is formed of stable Ni silicide (NiSi or $NiSi_2$) in which Ni and Si are bonded to each other. For this reason, the metal silicide MS except for the metal-rich layer MRL immediately under the contact hole CH will not be removed by the wet etching. By removing the metal-rich layer MRL in this manner, as shown in FIG. 6, a recess part RP is formed in the surface of the metal silicide MS.

In the metal silicide MS including the recess part RP formed therein, the thickness of a portion of the metal silicide MS situated immediately under the contact hole CH is relatively smaller than the thickness of a portion of the metal silicide MS situated around the contact hole CH. The recess part RP is formed, so that the film thickness of a portion of the metal silicide MS immediately under the contact hole CH is smaller than that of a portion of the metal silicide MS around the contact hole CH.

The metal-rich layer MRL is formed in the following manner. The silicon nitride film SNF is overetched, so that silicon comes out of the metal silicide MS. In other words, the thickness of the metal-rich layer MRL becomes equal to the thickness by which the silicon nitride film SNF has been overetched. Generally, the thickness by which the silicon nitride film SNF is overetched is 10% or more and 20% or less of the thickness of the silicon nitride film SNF.

Thus, the recess part RP can be formed so that the depth of the recess part RP formed in the surface of the metal silicide MS after removal of the metal-rich layer MRL is 10% or more and 20% or less of the thickness of the silicon nitride film SNF. Such a recess part RP is formed as a result of wet etching of the metal silicide MS in an amount equivalent to the thickness by which the silicon nitride film SNF has been overetched.

The composition of the metal silicide MS after removal of the metal-rich layer MRL is as follows: the metal and silicon are bonded to each other, resulting in stable NiSi. For this reason, even when a heat treatment at 400° C. or more is performed at the post step, the metal silicide MS can be prevented from growing toward the semiconductor substrate SUB side. In other words, the interface between the second impurity diffusion layer IDL2 and the metal silicide MS can be prevented from moving toward the semiconductor substrate SUB side. This can prevent the following: the metal silicide MS grows to the extension in the underlying part of the sidewall with a shallow pn junction, resulting in junction breakage.

Figure 7:
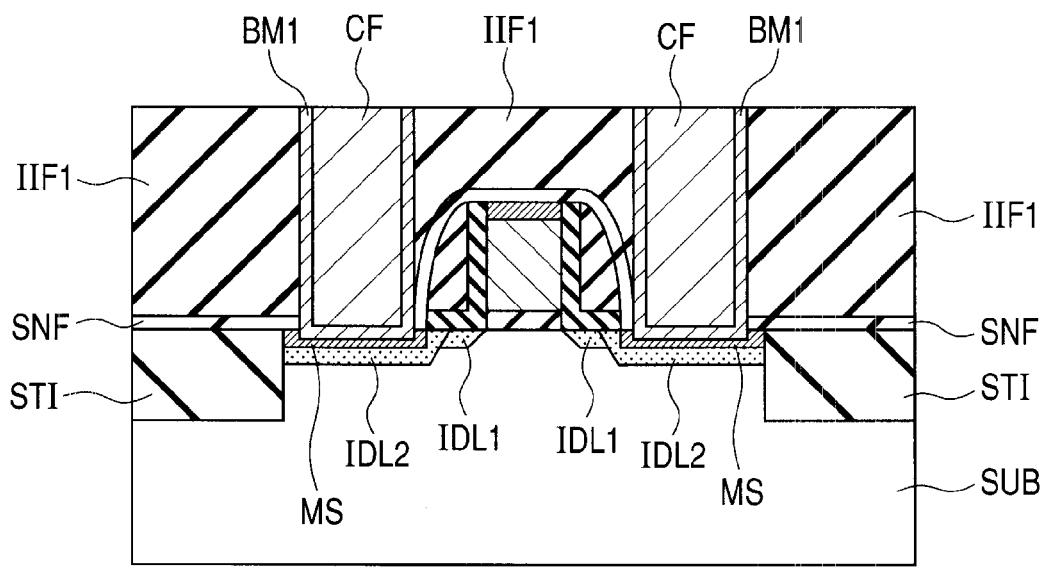
FIG. 7 is a schematic view showing a sixth step of the manufacturing method of the semiconductor device of Embodiment 1.

Subsequently, as shown in FIG. 7, with a CVD process or a PVD (Physical Vapor Deposition) process, a lamination film obtained by sequentially stacking Ti and TiN as a first barrier metal BM1 is formed so that their corresponding thicknesses are 5 nm or more and 20 nm or less, and 20 nm or more and 50 nm or less, respectively. Thereafter, a tungsten film (W film) as a conductive film CF is formed with a CVD process. Then, the portions of the first barrier metal BM1 and the conductive film CF in a region other than the contact holes CH are removed with an etch back process or a chemical mechanical polishing process.

Figure 8:
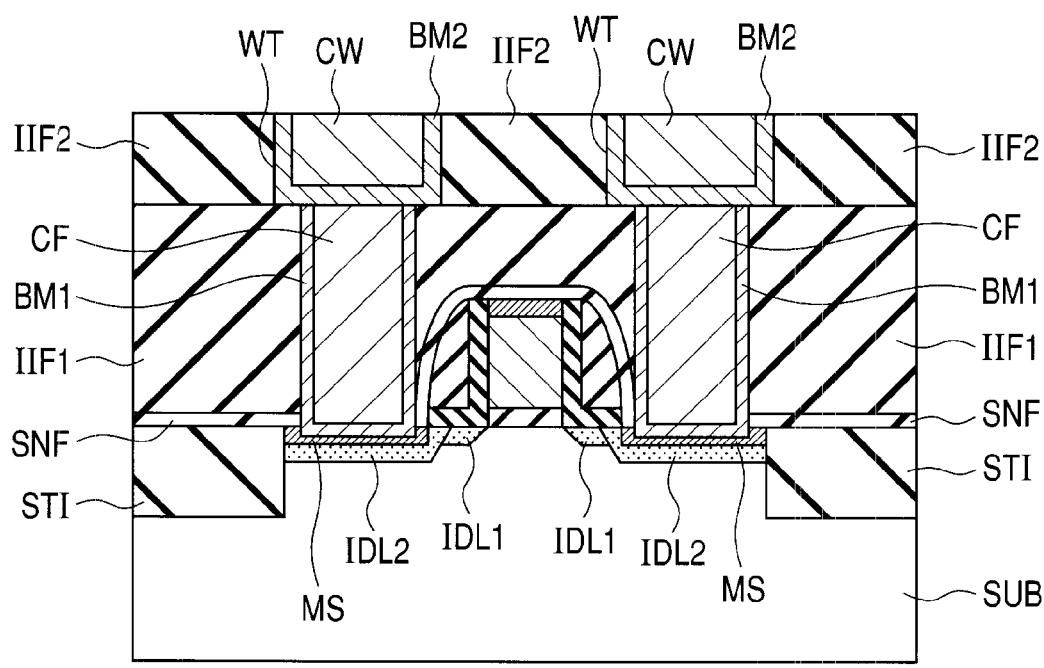
FIG. 8 is a schematic view showing a seventh step of the manufacturing method of the semiconductor device of Embodiment 1.

Thereafter, as shown in FIG. 8, a second interlayer insulation film IIF2 is formed with a CVD process. Further, a wiring trench WT is formed with combination of lithography and etching. Inside the wiring trench WT, for example, tantalum nitride (TaN) or titanium nitride (TiN) as a second barrier metal BM2 is formed with a thickness of 5 to 20 nm. Then, copper (Cu) is filled inside the wiring trench WT with a PVD process and a plating process, and the portions of the second barrier metal BM2 and copper in a region other than the wiring trench WT are removed with a chemical mechanical polishing process or an etch back process to form a copper wire as a conductive wire CW is formed in the wiring trench WT.

In this manner, a MISFET (Metal-Insulator-Semiconductor Field Effect Transistor) as an example of the semiconductor device of Embodiment 1 is manufactured. To the MISFET formed over the semiconductor substrate SUB, an electric signal is transferred via the conductive wire CW, and the first barrier metal BM1 and the conductive film CF formed in the contact hole CH.

The semiconductor device of this embodiment shown in FIG. 8 has the semiconductor substrate SUB containing silicon, and having a main surface. The semiconductor device further includes the first impurity diffusion layer IDL1 and the second impurity diffusion layer IDL2 as the impurity diffusion layers formed in the main surface of the semiconductor substrate SUB. The semiconductor device further has the metal silicide MS as the metal silicide layer formed over the impurity diffusion layer. The semiconductor device further has the silicon nitride film. SNF as the insulation film stacked over the metal silicide layer, and the first interlayer insulation film. IIF1. In the semiconductor device, the contact hole CH penetrating through the insulation film and reaching the surface of the metal silicide layer is formed (see FIG. 4). In the surface of the metal silicide layer, the recess part RP is formed (see FIG. 6). The thickness of the portion of the metal silicide MS situated immediately under the contact hole CH is smaller than the thickness of the portion of the metal silicide MS situated around the contact hole CH.

With such a configuration, as a result of etching and removal of the metal-rich layer MRL as the silicon depletion layer formed immediately under the contact hole CH, the recess part RP is formed in the surface of the metal silicide MS. Accordingly, the silicide reaction due to the subsequent heat treatment does not occur. Thus, the metal-rich layer MRL will not further consume silicon contained in the semiconductor substrate SUB. In other words, the portion of the metal silicide MS in the underlying part of the contact hole CH can be prevented from abnormally growing in the heat treatment after dry etching. This can prevent the malfunction and the increase in power consumption of the semiconductor device due to the PN junction breakage, which can provide a high-yield and fine semiconductor device.

Further, in the semiconductor device of this embodiment, the insulation film stacked over the metal silicide MS includes the silicon nitride film SNF as the first insulation film which overlaps a part of the metal silicide MS, and the first interlayer insulation film IIF1 as the second insulation film stacked over the silicon nitride film SNF. The depth of the recess part RP formed in the metal silicide MS is 10% or more and 20% or less of the thickness of the silicon nitride film SNF.

Such a recess part RP is formed as a result of removal of the metal-rich layer MRL formed in the metal silicide MS in an amount equivalent to the thickness by which the silicon nitride film SNF has been overetched. Typically, the whole of the metal-rich layer MRL formed by overetching of the silicon nitride layer SNF has been removed. For this reason, the metal-rich layer MRL will not further consume silicon contained in the semiconductor substrate SUB. In other words, the portion of the metal silicide MS in the underlying part of the contact hole CH can be prevented from growing in the heat treatment after dry etching. This can prevent the malfunction and the increase in power consumption of the semiconductor device due to the PN junction breakage.

Incidentally, after the step of removing the metal-rich layer MRL shown in FIG. 6, for example, a heat treatment at 450 to 600° C. for 30 seconds can be further applied thereto with a RTA (Rapid Thermal Anneal) process. In this case, the occurrence of a defect of junction leak current can be further suppressed.

Namely, in the case where the metal not bonding with silicon contained in the metal-rich layer MRL cannot be fully removed, when a heat treatment at a temperature as low as 300 to 400° C. is applied thereto for several hours in the post step, the metal atoms may diffuse into the Si substrate to increase the junction leak current. By performing a heat treatment at a temperature at which the metal is sufficiently silicided for a short time, it is possible to silicide the metal while preventing unnecessary diffusion of the metal. Therefore, it is possible to minimize the increase in junction leak current due to diffusion of the metal which has not been able to be fully removed.

As the RTA process, there can be used a lamp annealing process, a method in which a wafer is brought in direct contact with a heater set at a predetermined temperature, a method in which a wafer is indirectly heated by heat transfer with a gas such as He or $N_2$ interposed between it and a heater set at a predetermined temperature, or the like. Any process is acceptable so long as the process enables the wafer temperature to reach the temperature allowing sufficient silicidation for several seconds to about 30 seconds.

(Embodiment 2) As described in Embodiment 1, upon removal of the metal-rich layer MRL which is the silicon depletion metal silicide immediately under the contact hole CH, the portion of the metal silicide MS in the underlying part of the contact hole CH is reduced in film thickness. When the metal silicide MS is reduced in film thickness, the metal silicide MS may agglomerate by the heat treatment in the subsequent semiconductor manufacturing step. In other words, the metal silicide MS may grow in islands (balls) to be an ununiform or discontinuous film.

When the metal silicide MS agglomerates, the contact resistance between the contact plug and the source/drain regions formed over the semiconductor substrate increases, and the driving current of the transistor decreases. Thus, in this embodiment, agglomeration due to the reduction of the film thickness of the metal silicide MS immediately under the contact hole CH is prevented.

Figure 9:
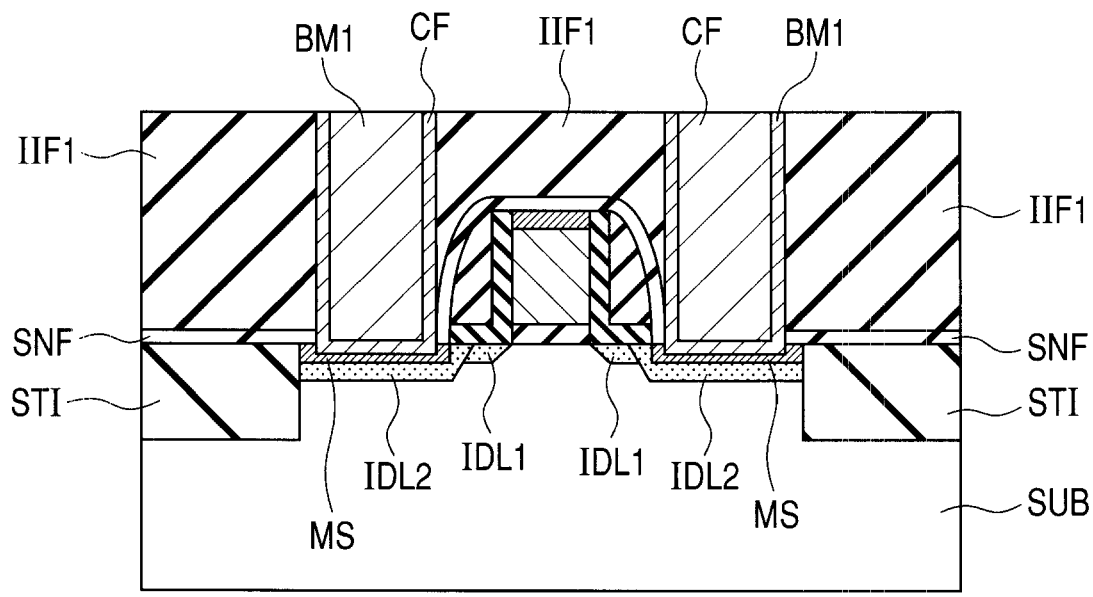
FIG. 9 is a schematic view showing a step of a manufacturing method of a semiconductor device of Embodiment 2.

FIG. 9 is a schematic view showing a step of a manufacturing method of a semiconductor device of Embodiment 2. After the step of removing the metal-rich layer MRL shown in FIG. 6, as shown in FIG. 9, the first barrier metal BM1 is formed. In Embodiment 1, as the first barrier metal BM1, a film of lamination of Ti and TiN was formed. However, in this embodiment, Ta (tantalum) is formed, resulting in a structure in which the metal silicide MS (NiSi or $NiSi_2$) and Ta are in direct contact with each other. In other words, the metal silicide MS exposed after removal of the metal-rich layer MRL is covered with the Ta layer.

Thereafter, TaN or TiN is formed as the upper layer film of the first barrier metal BM1 over Ta. Namely, the first barrier metal BM1 comprised of a lamination structure of Ta and a metal nitride film is formed. Thereafter, over the first barrier metal BM1, a conductive film CF comprised of a W film is formed. With a CMP (chemical mechanical polishing) process, the portion of the W film in a region other than the contact hole CH is removed.

In Embodiment 2, as the metal material forming the first barrier metal BM1, Ta is used in place of Ti. Tantalum (Ta) improves the heat resistance of the Ni silicide as distinct from titanium (Ti). In other words, Ta has an effect of suppressing the movement of atoms contained in NiSi, and suppressing agglomeration of Ni silicide.

Incidentally, tungsten (W), platinum (Pt), hafnium (Hf), or ruthenium (Ru) may be used, or may be combined in place of tantalum (W) as the metal for improving the heat resistance of Ni silicide to form the first barrier metal BM1.

As described up to this point, the semiconductor device of Embodiment 2 has the first barrier metal BM1 as the barrier metal layer formed in the contact hole CH, and the conductive film CF as the conductive layer formed over the first barrier metal BM1. The first barrier metal BM1 is formed of a material containing at least any one of Ta, W, Pt, Hf, and Ru.

With this configuration, by allowing NiSi to contain Ta, W, Pt, Hf, or Ru, the heat resistance of Ni silicide which is the metal silicide MS is improved. For this reason, even when the portion of the metal silicide MS in the underlying part of the contact hole CH becomes thin, the occurrence of morphology abnormality of agglomeration of the metal silicide MS in the subsequent heat treatment can be prevented. This can prevent the increase in contact resistance between the contact plug (conductive film CF) and the semiconductor substrate SUB. Therefore, it is possible to prevent the reduction of the driving current of the semiconductor device.

(Embodiment 3) In Embodiments 1 and 2, a description was given to the technology of suppressing the abnormal growth of the portion of the metal silicide MS in the underlying part of the contact hole CH by removing the Si-depleted metal silicide layer (metal-rich layer MRL). In this embodiment, there is provided a method for suppressing the Si depletion of the portion of the metal silicide MS in the underlying part of the contact hole CH. In other words, in this embodiment, there is provided a technology for preventing the formation of the metal-rich layer MRL in the manufacturing method of the semiconductor device.

Figure 10:
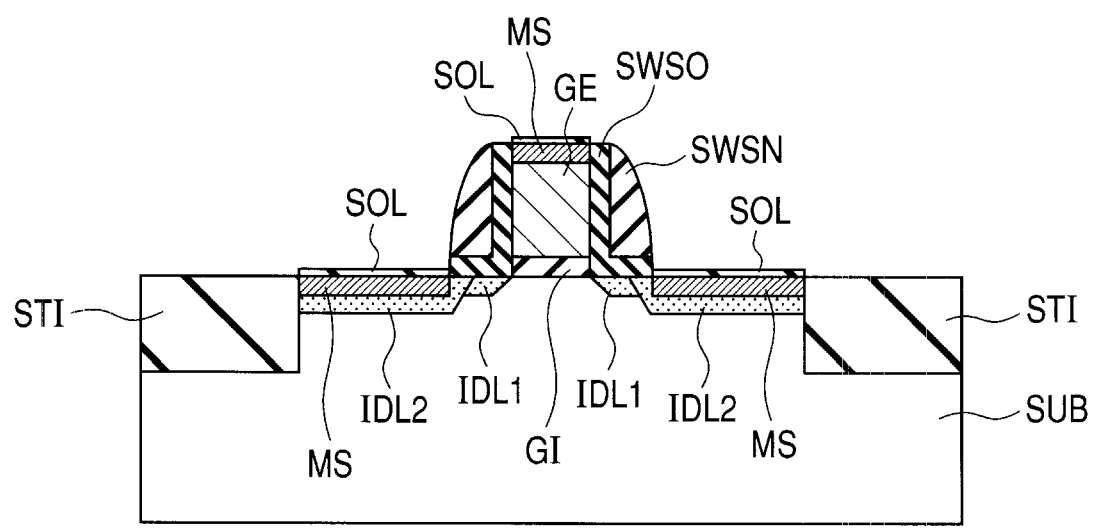
FIG. 10 is a schematic view showing a first step of a manufacturing method of a semiconductor device of Embodiment 3.
Figure 11:
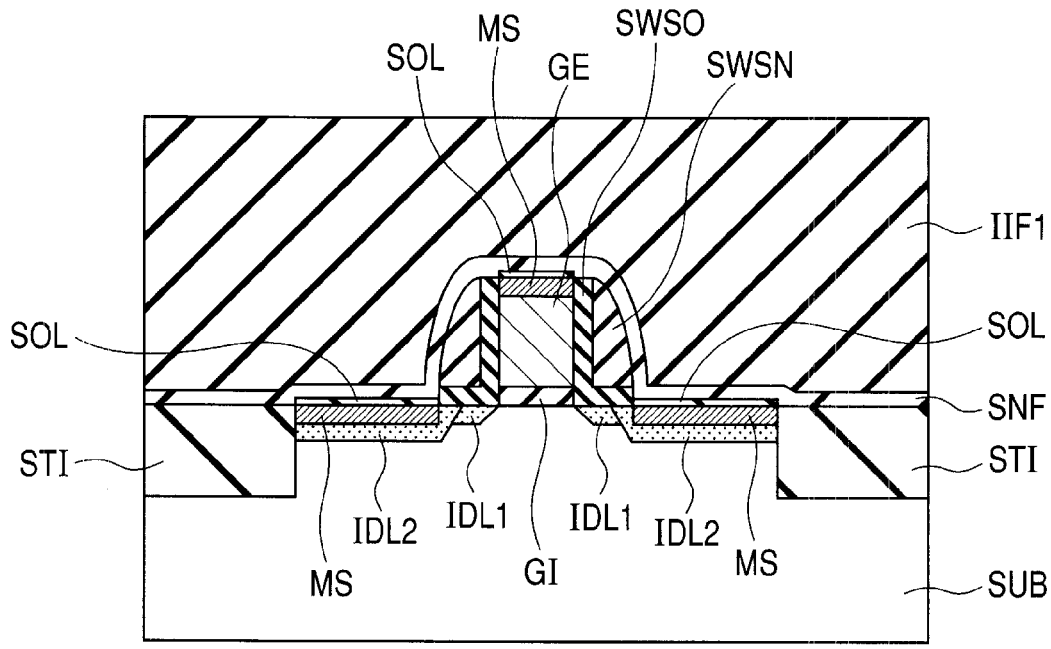
FIG. 11 is a schematic view showing a second step of the manufacturing method of the semiconductor device of Embodiment 3.
Figure 12:
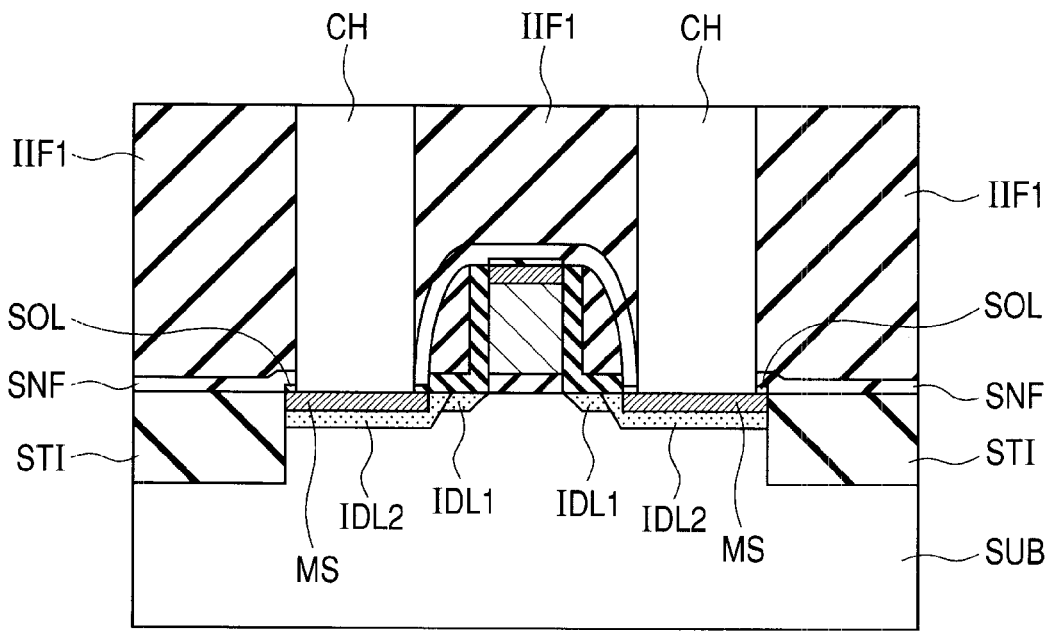
FIG. 12 is a schematic view showing a third step of the manufacturing method of the semiconductor device of Embodiment 3.

FIGS. 10 to 12 are schematic views for illustrating respective steps of a manufacturing method of a semiconductor device in accordance with Embodiment 3. After formation of the metal silicide MS by the steps shown in FIGS. 1 to 3, as shown in FIG. 10, a silicon oxide layer SOL as a protective insulation film is thinly stacked selectively over the metal silicide MS. The silicon oxide layer SOL can be formed so that the thickness is 5 nm or more and 10 nm or less.

For example, in the step of a heat treatment for forming the metal silicide MS, annealing is performed at a temperature as low as 400 to 500° C. in an atmosphere containing oxygen, i.e., in an atmosphere in which oxygen is contained in an amount of several tens percent in nitrogen. As a result, silicon in the surface of the metal silicide MS is oxidized. Thus, the silicon oxide layer SOL can be formed with ease. Alternatively, for example, silicon in the surface of the metal silicide MS may be oxidized in the following manner. After formation of the metal silicide MS, the surface of the metal silicide MS is exposed to an oxygen plasma (e.g., the treatment is performed under the conditions where the resist is removed with a conventional photoresist asking device).

Then, over the silicon oxide layer SOL, a silicon nitride film SNF as an etching stopper film is formed with a CVD process so that the thickness is 10 to 50 nm. Further, over the etching stopper film, a first interlayer insulation film IIF1 as an insulation film is formed with a CVD process so that the thickness is 500 to 1000 nm. The first interlayer insulation film IIF1 is formed of a silicon oxide film.

Then, a contact hole CH is formed with combination of lithography and etching. With dry etching, first, the silicon oxide film which is the first interlayer insulation film IIF1 is etched with the silicon nitride film SNF as an etching stopper.

Thereafter, the silicon nitride film SNF is etched with the silicon oxide layer SOL as an etching stopper. Further, the silicon oxide layer SOL overlying the metal silicide MS is etched. Then, the contact hole CH penetrating through the first interlayer insulation film IIF1, the silicon nitride film SNF, and the silicon oxide layer SOL and reaching the surface of the metal silicide MS is formed.

For etching of the silicon nitride film. SNF, the silicon oxide layer SOL serves as the etching stopper of the silicon nitride film SNF. Thus, the metal silicide MS will not be directly etched. Accordingly, it is possible to prevent the depletion of silicon in the metal silicide MS.

The silicon oxide layer SOL as the protective insulation film for protecting the metal silicide MS is removed by etching. It is preferable to minimize the effect exerted on the composition of the metal silicide MS when the silicon oxide layer SOL is removed. For this reason, in order that the silicon oxide layer SOL can be removed with ease, for example, the thickness of the silicon oxide layer SOL may be formed smaller than the thickness of the silicon nitride film SNF. As the etching technology for removing the silicon oxide layer SOL, wet etching is desirably used because use of dry etching may conceivably result in overetching of the metal silicide MS. Alternatively, as the method for removing the silicon oxide layer SOL, removal thereof may be performed in-situ prior to formation of the barrier metal by a sputtering etching process with Ar (argon) or the like, or a chemical cleaning process (e.g., a plasma treatment with a mixed gas of $NF_3$ and $H_2$) by means of a device for forming the first barrier metal BM1.

As described above, the semiconductor device of Embodiment 3 has a semiconductor substrate SUB containing silicon, and having a main surface. The semiconductor device further has the first impurity diffusion layer IDL1 and the second impurity diffusion layer IDL2 as the impurity diffusion layers formed in the main surface of the semiconductor substrate SUB. The semiconductor device further has the metal silicide MS as the metal silicide layer formed over the impurity diffusion layers.

The semiconductor device further has the protective insulation film which overlaps a part of the metal silicide MS, and the etching stopper film stacked over the protective insulation film, and the insulation film stacked over the etching stopper film. The protective insulation film includes the silicon oxide layer SOL. The etching stopper film includes the silicon nitride film SNF. The insulation film includes the first interlayer insulation film IIF1 comprised of the silicon oxide film. The semiconductor device further has, as with Embodiment 1, the first barrier metal BM1 as the barrier metal layer formed in the contact hole CH, and the conductive film CF as the conductive film formed over the first barrier metal BM1 (see FIGS. 7 and 8).

In the semiconductor device, as shown in FIG. 12, the contact hole CH penetrating through the first interlayer insulation film IIF1, the silicon nitride film SNF, and the silicon oxide layer SOL and reaching the surface of the metal silicide MS is formed. The contact hole CH is formed by etching the silicon oxide layer SOL overlapping the metal silicide MS, the silicon nitride film SNF, and the first interlayer insulation film IIF1. The first interlayer insulation film IIF1 is etched with the silicon nitride film SNF as the etching stopper. The silicon nitride film SNF is etched with the silicon oxide layer SOL as the etching stopper.

With this configuration, the silicon oxide layer SOL is formed over the metal silicide MS. Accordingly, when the silicon nitride film SNF is overetched, the silicon oxide layer SOL prevents etching of the metal silicide MS. In other words, when the silicon nitride film SNF is etched, the surface of the metal silicide MS is not exposed, which can prevent depletion of silicon in the metal silicide MS. Therefore, the metal silicide MS depleted of silicon (i.e., the metal-rich layer MRL) can be prevented from being formed in the underlying part of the contact hole CH. This can prevent the malfunction and the increase in power consumption of the semiconductor device due to the PN junction breakage.

In the foregoing description of Embodiments 1 to 3, a description was given to the semiconductor device using a silicon substrate as the semiconductor substrate SUB. However, the semiconductor substrate SUB may be formed of a material containing silicon such as SiGe (silicon germanium).

Further, Ni silicide was mentioned as an example of the metal silicide MS. However, for example, a metal silicide MS comprised of an alloy of Ni and another metal is also acceptable. When the metal silicide MS is a Ni alloy, as another metal, at least any one of, for example, Pt, Pd, V, Hf, Ta, W, Co, Er, and Yb may be selected.

The embodiments of the present invention were described as above. However, the constitutions of respective embodiments may be appropriately combined. Further, the embodiments disclosed this time should be considered illustrative, but not limiting in all respects. The scope of this invention is defined not by the foregoing description but by the appended claims, and is intended to include the meanings equivalent to the claims, and all changes within the scope.

This invention is applicable to semiconductor devices in general. Particularly, the invention is advantageously applicable to semiconductor devices in each of which a metal silicide (particularly, Ni silicide) is formed in the source/drain regions, such as 45 nm or later generation highly integrated SOC (System on a Chip, an integrated circuit including the main function of the device (system) mounted in one chip), and SRAM (Static Random Access Memory), and a manufacturing method thereof.

What is claimed is:

1. A manufacturing method of a semiconductor device, comprising the steps of:
    preparing a semiconductor substrate containing silicon;
    forming an impurity diffusion layer in the surface of the semiconductor substrate;
    forming a metal silicide layer over the impurity diffusion layer;
    stacking an insulation film over the metal silicide layer;
    a first etching step of forming a contact hole penetrating through the insulation film and reaching the surface of the metal silicide layer;
    a second etching step of etching a silicon depletion layer formed by the first etching step, and forming a recess part in the surface of the metal silicide layer;
    forming a barrier metal layer in the contact hole; and
    forming a conductive layer over the barrier metal layer.

2. The manufacturing method of a semiconductor device according to claim 1, wherein the barrier metal layer contains at least any one of Ta, W, Pt, Hf, and Ru.

3. The manufacturing method of a semiconductor device according to claim 1,
    wherein the insulation film includes a first insulation film overlapping the metal silicide layer, and a second insulation film stacked over the first insulation film, and
    wherein the recess part is formed so as to have a depth of 10% or more and 20% or less of the thickness of the first insulation film.

* * * * *